US011302511B2

(12) United States Patent
Brodie et al.

(10) Patent No.: US 11,302,511 B2
(45) Date of Patent: Apr. 12, 2022

(54) FIELD CURVATURE CORRECTION FOR MULTI-BEAM INSPECTION SYSTEMS

(71) Applicant: KLA-Tencor Corporation, Milpitas, CA (US)

(72) Inventors: Alan Brodie, Palo Alto, CA (US); Rainer Knippelmeyer, Groton, MA (US); Christopher Sears, Fremont, CA (US); John Rouse, Mitcham (GB); Grace Hsiu-Ling Chen, Los Gatos, CA (US)

(73) Assignee: KLA Corporation, Milpitas, CA (US)

( * ) Notice: Subject to any disclaimer, the term of this patent is extended or adjusted under 35 U.S.C. 154(b) by 681 days.

(21) Appl. No.: 15/173,144

(22) Filed: Jun. 3, 2016

(65) Prior Publication Data
US 2017/0229279 A1 Aug. 10, 2017

Related U.S. Application Data

(60) Provisional application No. 62/291,120, filed on Feb. 4, 2016.

(51) Int. Cl.
H01J 37/12 (2006.01)
H01J 37/28 (2006.01)
(Continued)

(52) U.S. Cl.
CPC ............ H01J 37/12 (2013.01); H01J 37/153 (2013.01); H01J 37/21 (2013.01); H01J 37/28 (2013.01);
(Continued)

(58) Field of Classification Search
CPC .. H01J 37/28; H01J 37/12; H01J 37/04; H01J 37/10; H01J 37/3177; H01J 2237/31774;
(Continued)

(56) References Cited

U.S. PATENT DOCUMENTS 6,124,599 A 9/2000 Muraki
2002/0160311 A1 10/2002 Muraki et al.
(Continued)

FOREIGN PATENT DOCUMENTS

JP 2001332473 A 11/2001
JP 2013196951 A 9/2013
(Continued)

OTHER PUBLICATIONS

Partial Supplementary EP Search Report dated Sep. 5, 2019 for EP Application No. 17748087.8.
(Continued)

Primary Examiner — Wyatt A Stoffa
(74) Attorney, Agent, or Firm — Suiter Swantz pc llo

(57) ABSTRACT

Multi-beam e-beam columns and inspection systems that use such multi-beam e-beam columns are disclosed. A multi-beam e-beam column configured in accordance with the present disclosure may include an electron source and a multi-lens array configured to produce a plurality of beamlets utilizing electrons provided by the electron source. The multi-lens array may be further configured to shift a focus of at least one particular beamlet of the plurality of beamlets such that the focus of the at least one particular beamlet is different from a focus of at least one other beamlet of the plurality of beamlets.

8 Claims, 7 Drawing Sheets

(51) Int. Cl.
*H01J 37/21* (2006.01)
*H01J 37/153* (2006.01)

(52) U.S. Cl.
CPC .............. *H01J 2237/1207* (2013.01); *H01J 2237/1534* (2013.01); *H01J 2237/1536* (2013.01); *H01J 2237/21* (2013.01); *H01J 2237/2801* (2013.01); *H01J 2237/2817* (2013.01)

(58) Field of Classification Search
CPC .......... H01J 2237/1207; H01J 2237/21; H01J 37/153; H01J 37/21; H01J 2237/1534; H01J 2237/1536; H01J 2237/2801; H01J 2237/2817
See application file for complete search history.

(56) References Cited

U.S. PATENT DOCUMENTS

| | | | |
|---|---|---|---|
| 2003/0066974 A1* | 4/2003 | Muraki | B82Y 40/00 250/492.2 |
| 2003/0132382 A1 | 7/2003 | Sogard | |
| 2006/0108531 A1 | 5/2006 | Lo et al. | |
| 2012/0027284 A1 | 2/2012 | Hung et al. | |
| 2012/0241606 A1 | 9/2012 | Han et al. | |
| 2013/0248731 A1* | 9/2013 | Tanimoto | H01J 37/153 250/396 R |
| 2014/0103223 A1* | 4/2014 | Tsunoda | B82Y 10/00 250/396 R |
| 2014/0158902 A1* | 6/2014 | Knippelmeyer | H01J 37/10 250/396 R |
| 2014/0197325 A1* | 7/2014 | Kato | H01J 37/3177 250/396 R |
| 2015/0276616 A1 | 10/2015 | Horn | |
| 2016/0268117 A1* | 9/2016 | Ramsey | H01J 49/0022 |
| 2017/0287674 A1* | 10/2017 | Knippelmeyer | H01J 37/28 |

FOREIGN PATENT DOCUMENTS

| | | |
|---|---|---|
| JP | 2015111571 A | 6/2015 |
| TW | 201513246 A | 4/2015 |

OTHER PUBLICATIONS

Muraki, Masato et al., "New concept for high-throughput multielectron beam direct write system", J. Vac. Sci. Technol. B 18(6), Nov./Dec. 2000, pp. 3061-3066.

Van Bruggen, M. J. et al., "Development of a multi-electron-beam source for sub-10 nm electron beam induced deposition", J. Vac. Sci. Technol. B 23(6), Nov./Dec. 2005, pp. 2833-2839.

Office Action received for Taiwanese Application No. 106103690 dated Sep. 9, 2020, 6 pages.

Office Action in Japanese Application No. 2018-540737 dated Dec. 1, 2020, 18 pages (with English Translation).

* cited by examiner

FIELD CURVATURE CORRECTION FOR MULTI-BEAM INSPECTION SYSTEMS

CROSS-REFERENCE TO RELATED APPLICATIONS

The present application claims the benefit under 35 U.S.C. § 119(e) of U.S. Provisional Application Ser. No. 62/291,120, filed Feb. 4, 2016. Said U.S. Provisional Application Ser. No. 62/291,120 is hereby incorporated by reference in its entirety.

TECHNICAL FIELD

The disclosure generally relates to the field of inspection systems, and particularly to electron beam inspection systems.

BACKGROUND

Thin polished plates such as silicon wafers and the like are a very important part of modern technology. A wafer, for instance, may refer to a thin slice of semiconductor material used in the fabrication of integrated circuits and other devices.

Wafers and reticles are subject to defect inspections, and electron beam (e-beam) inspection is considered one of the most sensitive forms of defect inspection for wafers. However, throughputs of presently available e-beam inspection systems are very limited and improvements are needed.

SUMMARY

The present disclosure is directed to an apparatus. The apparatus may include an electron source and a multi-lens array configured to produce a plurality of beamlets utilizing electrons provided by the electron source. The multi-lens array may be further configured to shift a focus of at least one particular beamlet of the plurality of beamlets such that the focus of the at least one particular beamlet is different from a focus of at least one other beamlet of the plurality of beamlets.

A further embodiment of the present disclosure is an apparatus. The apparatus may include an electron source and a multi-lens array configured to produce a plurality of beamlets utilizing electrons provided by the electron source. The multi-lens array may be further configured to shift a focus of at least one particular beamlet of the plurality of beamlets such that the focus of the at least one particular beamlet is different from a focus of at least one other beamlet of the plurality of beamlets. The apparatus may also include at least one additional lens configured to receive the plurality of beamlets and deliver the plurality of beamlets toward a target.

An additional embodiment of the present disclosure is directed to an inspection system. The inspection system may include an electron source and a multi-lens array configured to produce a plurality of beamlets utilizing electrons provided by the electron source. The multi-lens array may be further configured to shift a focus of at least one particular beamlet of the plurality of beamlets such that the focus of the at least one particular beamlet is different from a focus of at least one other beamlet of the plurality of beamlets. The inspection system may also include at least one additional lens configured to receive the plurality of beamlets and deliver the plurality of beamlets toward a subject of inspection. The inspection system may further include a detector configured to produce one or more images of the subject of inspection by scanning the subject of inspection with the plurality of beamlets.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to multi-beam e-beam columns and inspection systems that use such multi-beam e-beam columns. A multi-beam e-beam column configured in accordance with the present disclosure may use a single electron source to produce multiple electron beams. Creating multiple electron beams provides a larger field of view and increases the total beam current of an inspection system, which in turn improves the throughput of the inspection system.

A multi-beam e-beam column configured in accordance with the present disclosure may also implement various types of mechanisms configured to help correct field curvature effects. Field curvature effects may be naturally present in lenses used to deliver the electron beams (e.g., the final or objective lens in particular). Field curvature effects may cause focus shift of the electron beams, resulting in delivery of electron beams that are not precisely focused on to the same focal plane. Without field curvature correction, the spot sizes of the beams at the outer edges of a scanning area may be blurred (due to focus shift), limiting the number of beams that can be used to perform the inspection, hence limiting the overall scalability of the multi-beam inspection system. Therefore, in some embodiments, the beams may be scanned by a small amount so that field curvature effects can be mitigated at each individual beam. However, the outer beams may still have field curvature by the fact they are positioned at a large radius.

Figure 1:
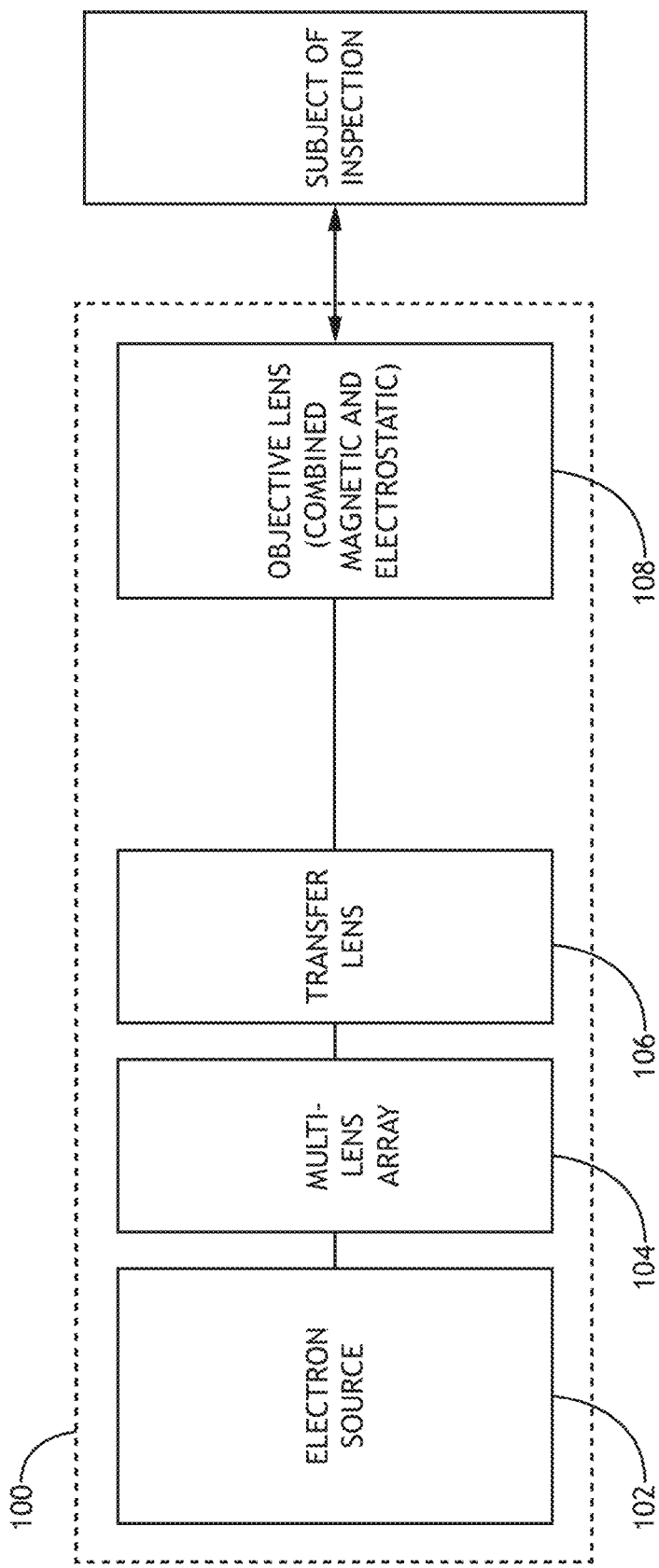
FIG. 1 is a block diagram depicting a multi-beam e-beam column configured in accordance with an embodiment of the present disclosure.

To address this issue, a multi-beam e-beam column configured in accordance with the present disclosure may intentionally pre-distort the electron beams it produces in a controlled manner before delivering the electron beams to lenses that are known to cause focus shift. Referring to FIG. 1, for example, if one or more lenses in the transfer lens group 106 and/or the objective lens group 108 of an e-beam column 100 are known to cause focus shift, a multi-lens array 104 may be utilized to pre-distort (e.g., focus shift in an opposite manner) the electron beams before delivering the electron beams to the transfer lens group 106 and/or the objective lens group 108.

Figure 2:
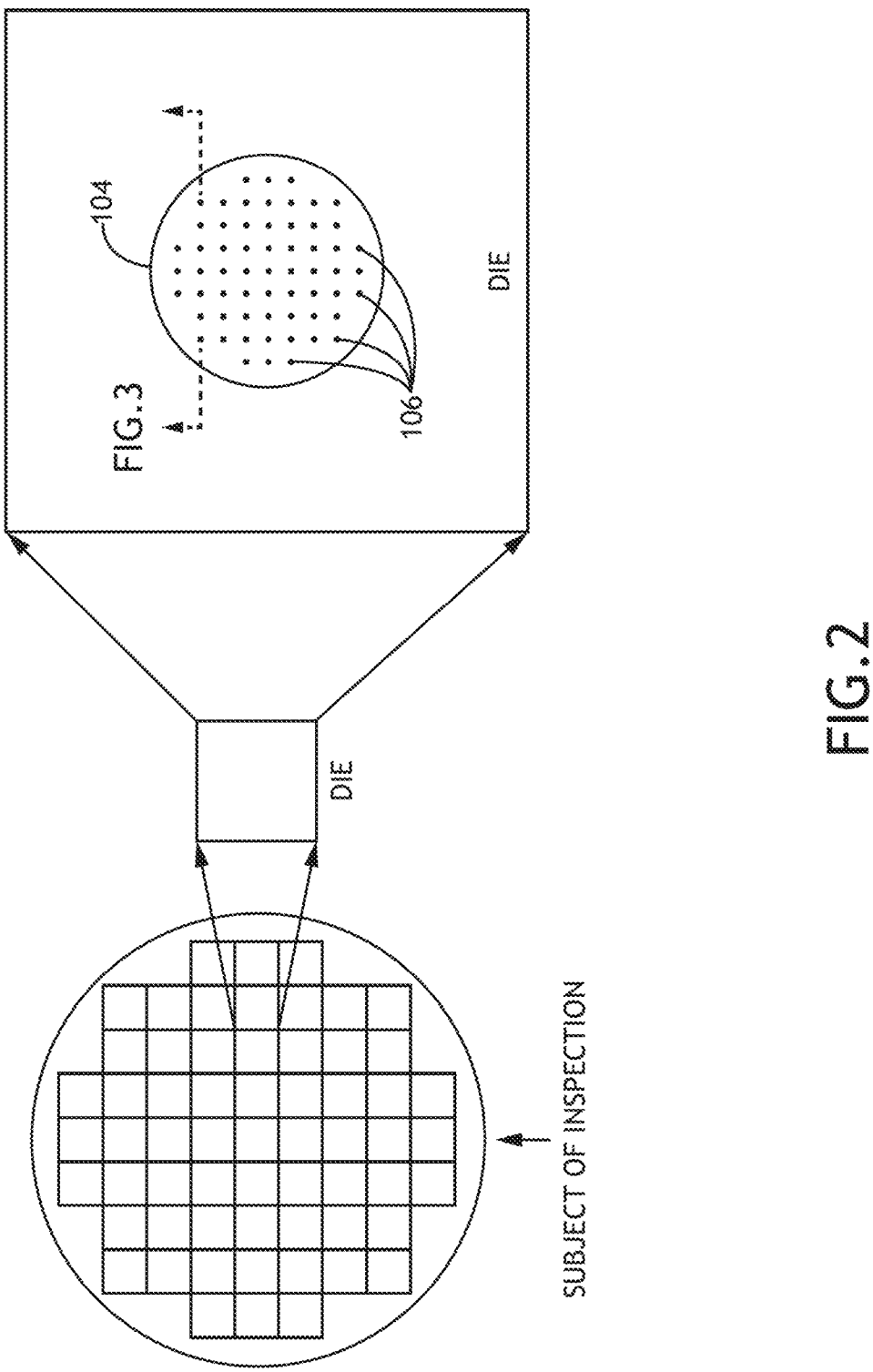
FIG. 2 is an illustration depicting a top view of a multi-lens array configured in accordance with an embodiment of the present disclosure.
Figure 3:
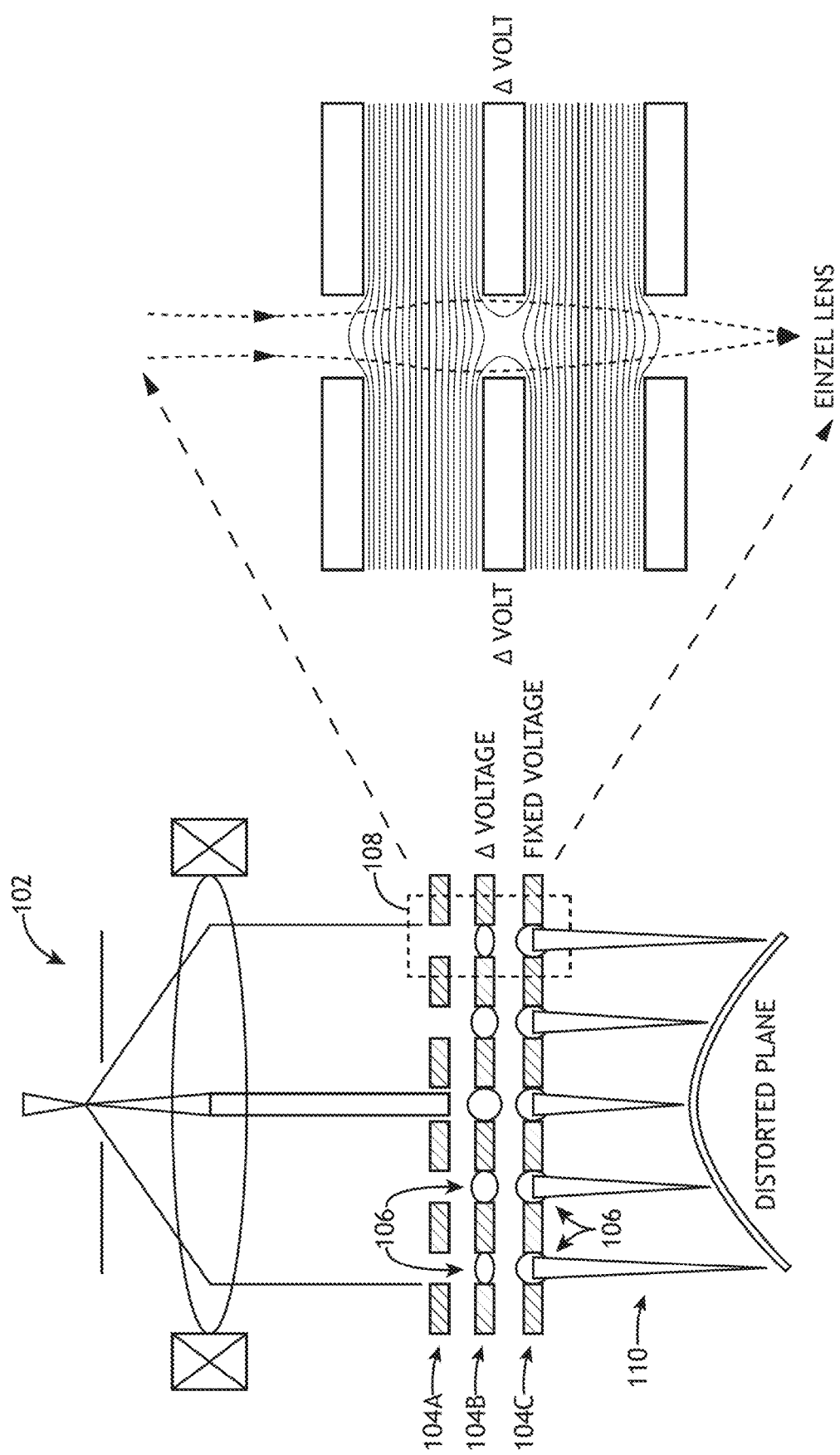
FIG. 3 is an illustration depicting a cross-sectional view of a multi-lens array configured in accordance with an embodiment of the present disclosure.
Figure 4:
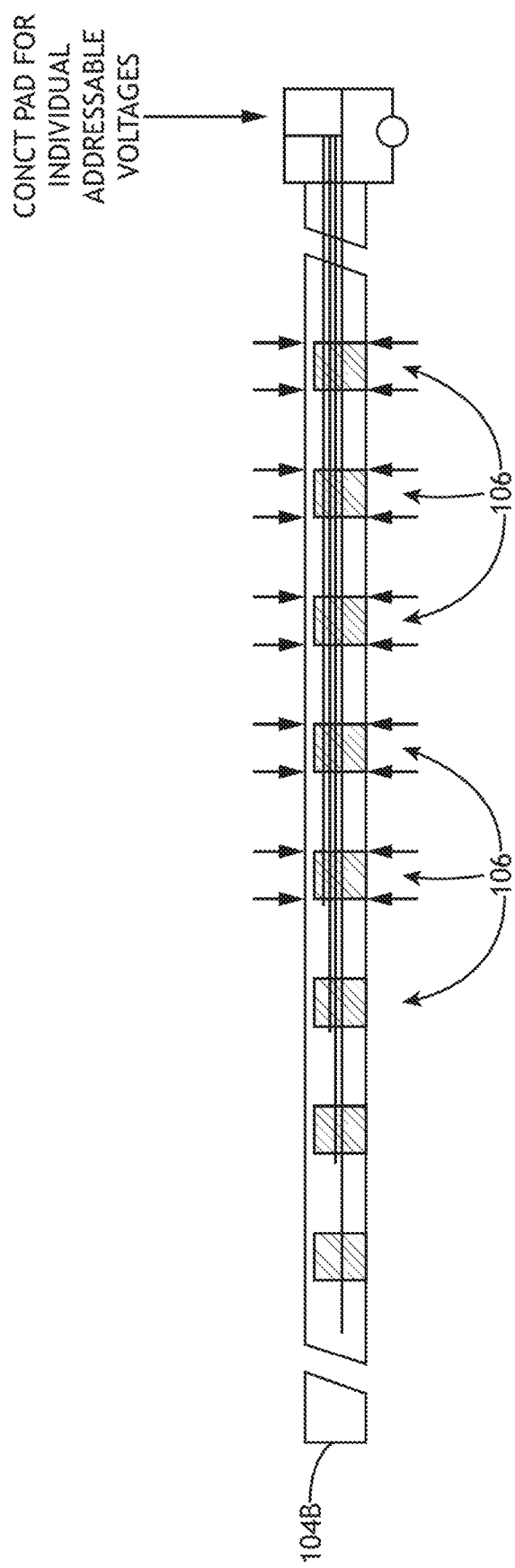
FIG. 4 is a cross-sectional view of an electrostatic plate of a multi-lens array configured in accordance with an embodiment of the present disclosure.

Referring now to FIGS. 2-4, an exemplary implementation of a multi-lens array 104 configured in accordance with the present disclosure is shown. The multi-lens array 104 may receive electrons provided by the electron source 102 through a device (e.g., a lens) configured to collimate and/or illuminate the multi-lens array 104. The multi-lens array 104 may include three (or more) stacked electrostatic plates 104A-104C with openings (e.g., circular holes) 106 defined therein. The stacked electrostatic plates 104A-104C with openings 106 defined therein may form a plurality of einzel lenses 108 that are capable of producing a plurality of electron beams (may be referred to as beamlets) 110 using the electrons provided by the electron source 102. One of the electrostatic plates, shown as the electrostatic plate 104C in FIG. 3, for example, may be supplied with a potential (voltage) so that the openings 106 defined on the electrostatic plate 104C can serve as an aperture lens array, which may help focus the plurality of beamlets 110.

It is noted that the focus of the beamlets 110 shown in FIG. 3 are intentionally shifted so that the beamlets 110 are not all focused on to the same plane. The purpose of this intentional focus shift is to compensate for the focus shift that is expected to occur when the beamlets 110 pass through one or more downstream lenses (e.g., the transfer lens group 106 and/or the objective lens group 108 depicted in FIG. 1). In some embodiments, the intentional focus shift may be provided by supplying one of the electrostatic plates (e.g., the electrostatic plate 104B shown in FIGS. 3 and 4) with individually addressable potentials (voltages) around its openings 106, which may allow the electrostatic plate 104B to individually adjust the focus of the beamlets 110.

It is to be understood that the electrostatic plate 104B is depicted as the electrostatic plate that provides the intentional focus shift merely for illustrative purposes. It is contemplated that any one (or a combination) of the stacked electrostatic plates of the multi-lens array 104 may be configured to provide the intentional focus shift without departing from the spirit and the scope of the present disclosure. It is also contemplated that while specific implementations of the multi-lens array 104 may vary, the purpose of the multi-lens array 104 remains the same, which is to compensate for the focus shift that is expected to occur when the beamlets 110 produced by the multi-lens array 104 pass through the one or more downstream lenses. It is therefore contemplated that the downstream lenses may be studied accordingly to help determine how to pre-distort the beamlets so that the intentional focus shift (introduced by the multi-lens array 104) and the expected focus shift (expected to be introduced by the downstream lenses) substantially cancels out each other. It is to be understood that such studies may be carried out in various manners without departing from the spirit and scope of the present disclosure.

It is also contemplated that additional parameters may be taken into consideration when designing/constructing the multi-lens arrays 104. In some embodiments, the electrostatic plates of a multi-lens array 104 may be configured as circular plates having a thickness between approximately 50 and 300 µm and a diameter between approximately 7 and 40 mm. The distances between two adjacent electrostatic plates may be less than or equal to approximately 1 mm. Additionally, the openings 106 defined on the electrostatic plates may form a generally hexagonal pattern with center-to-center distances of two adjacent openings 106 ranging between approximately 80 and 120 µm. Furthermore, the diameters of the openings 106 may range between approximately 20 and 50 µm, and in some embodiments, the openings 106 defined on the electrostatic plate that is configured to function as an aperture lens array (e.g., the electrostatic plate 104C in FIG. 3) may have a diameter that is approximately 5 to 10 µm less than the diameters of the openings 106 defined on the other electrostatic plates.

It is to be understood that the specific dimensions presented above are provided for illustrative purposes and are not meant to be limiting. It is contemplated that the dimensions may vary without departing from the spirit and scope of the present disclosure.

Figure 5:
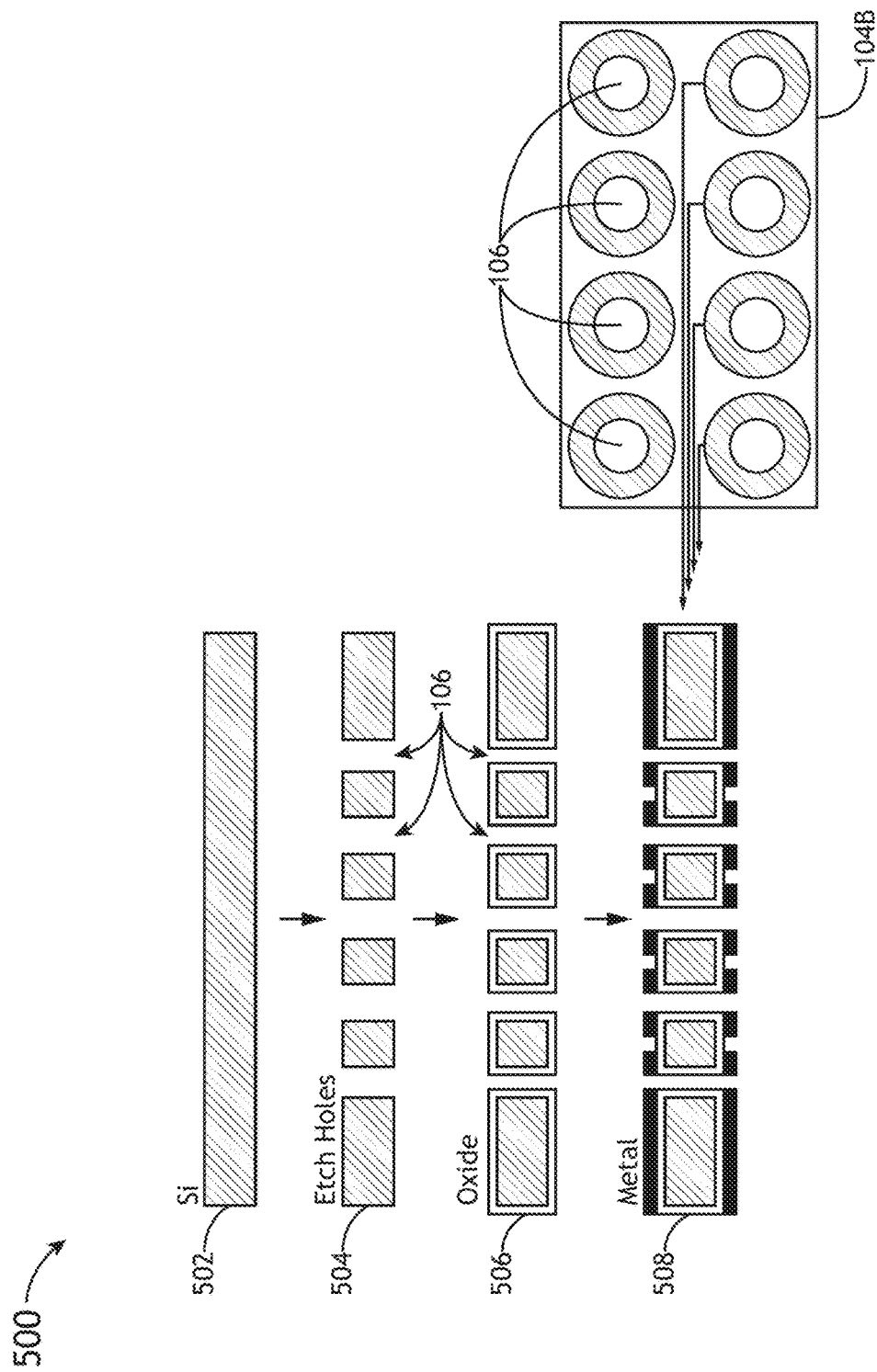
FIG. 5 is an illustration depicting an exemplary fabrication process for fabricating an electrostatic plate of a multi-lens array configured in accordance with an embodiment of the present disclosure.
Figure 6:
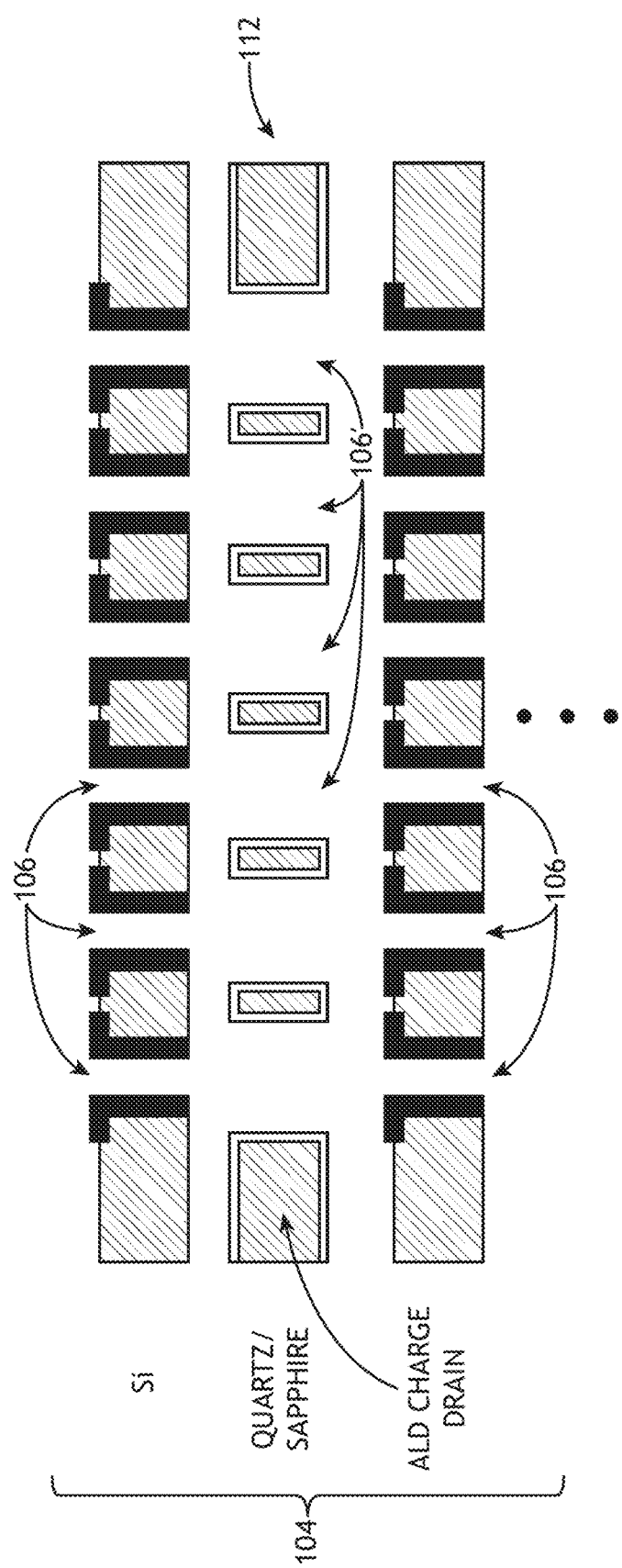
FIG. 6 is an illustration depicting an exemplary fabrication process for fabricating a multi-lens array configured in accordance with an embodiment of the present disclosure.

It is also contemplated that the multi-lens array 104 may be fabricated utilizing various types of fabrication techniques without departing from the spirit and scope of the present disclosure. FIGS. 5 and 6 are illustrations depicting some of the techniques that may be utilized during the fabrication process.

More specifically, FIG. 5 shows an exemplary fabrication process 500 that may be utilized to fabricate the electrostatic plate 104B shown in FIG. 4. Upon receiving a silicon substrate in a step 502, for example, openings 106 may be patterned by photo or electron beam lithography then etched into the silicon substrate in a step 504 and the silicon substrate with the etched openings 106 may be oxidized in a step 506. The openings 106 may then be individually coated with one or more conductive materials (e.g., metal) in a step 508, allowing the openings 106 to be individually addressable as previously described.

FIG. 6 shows an exemplary fabrication process where an optional insulating layer 112 is inserted between two adjacent electrostatic plates of the multi-lens array 104. The insulating layer 112 may include a quartz or sapphire substrate with openings 106' defined to generally coincide with the openings 106 defined on the electrostatic plates of the multi-lens array 104. The size of the openings 106' defined on the insulating layer 112 may be larger than the size of the openings 106 defined on the electrostatic plates of the multi-lens array 104 to avoid interfering with the operations of the multi-lens array 104. The insulating layer 112 may be coated with atomic layer deposition (ALD) charge drains to help mitigate cross talks that may occur between the adjacent electrostatic plates, providing a feature that may be appreciated in various operating conditions.

It is to be understood that the fabrication techniques depicted in FIGS. 5 and 6 are presented for illustrative purposes and are not meant to be limiting. It is contemplated that the fabrication techniques depicted in FIGS. 5 and 6, as well as various other types of fabrication techniques not explicitly disclosed herein, may be utilized to fabricate the multi-lens array 104 without departing from the spirit and scope of the present disclosure.

Figure 7:
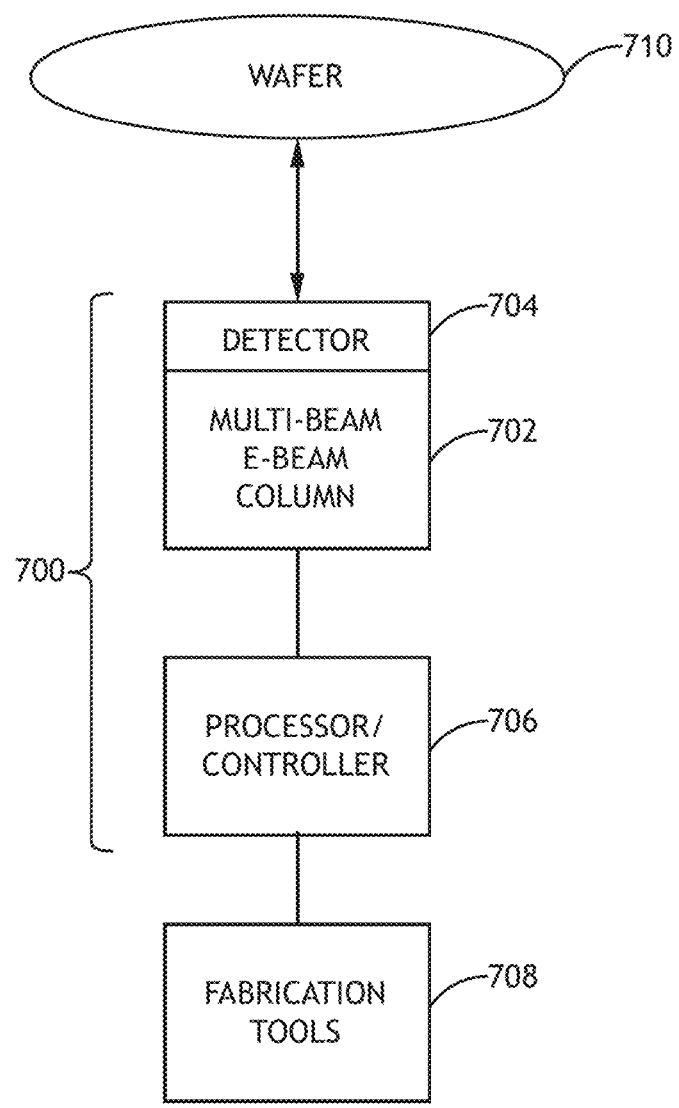
FIG. 7 is a block diagram depicting an inspection system that uses a multi-beam e-beam column configured in accordance with an embodiment of the present disclosure.

Referring now to FIG. 7, a block diagram depicting an inspection system 700 configured in accordance with the present disclosure is shown. The inspection system 700 may include a multi-beam e-beam column 702 configured to deliver a plurality of focused electron beams (beamlets) toward a subject of inspection (e.g., a wafer) 710. The inspection system 700 may also include a detector (e.g., an electron microscope) 704 configured to produce one or more images of the wafer 710 by scanning the wafer 710 using the plurality of beamlets. The inspection system 700 may further include one or more processors 706 configured to carry out various types of analysis processes based on the images produced by the detector 704. It is contemplated that the processor(s) 706 may be configured to report the result of the inspection to a user. Alternatively and/or additionally, the processor(s) 706 may be configured to provide (e.g., feedforward or feedback) its output to one or more fabrication tools 708 used to fabricate the wafer 710, allowing the fabrication tools 708 to make appropriate adjustments if needed.

It is noted that because the inspection system 700 uses an e-beam column 702 that is capable of producing multiple beamlets, the throughput of the inspection system 700 can be significantly improved compared to a single-beam system. It is also noted that because the e-beam column 702 used by the inspection system 700 is capable of correcting field curvature effects, the beamlets delivered to the wafer 710 can be focused precisely across the entire field of view of the e-beam column 702, further improving the efficiency of the inspection system 700.

It is to be understood that while the examples above referred to a wafer as the subject of inspection, the inspection systems configured in accordance with the present disclosure are not limited to inspecting wafers. The inspection systems configured in accordance with the present disclosure are applicable to other types of subjects as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is believed that the system and the apparatus of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. An apparatus, comprising:
an electron source; and
a multi-lens array configured to produce a plurality of beamlets utilizing electrons provided by the electron source, the multi-lens array further configured to shift a focus of at least one particular beamlet of the plurality of beamlets such that the focus of the at least one particular beamlet is different from a focus of at least one other beamlet of the plurality of beamlets, wherein the multi-lens array includes at least two electrostatic plates with openings defined therein to form an array of lenses, wherein the at least two electrostatic plates comprise a first electrostatic plate and a second electrostatic plate, wherein an insulating layer is positioned between the first electrostatic plate and the second electrostatic plate, wherein the first electrostatic plate and the second electrostatic plate each include a plurality of etched openings, wherein the etched openings are individually coated with a conductive material to allow individually addressable potentials to be applied to the etched openings via a contact pad, wherein the insulating layer includes a plurality of openings, wherein the size of the openings of the insulating layer is larger than the size of the etched openings of the first electrostatic plate and the second electrostatic plate, wherein the insulating layer includes charge drains to mitigate cross-talk between the first electrostatic plate and the second electrostatic plate.

2. The apparatus of claim 1, wherein at least one of the first electrostatic plate or the second electrostatic plate comprise an oxidized silicon plate with the openings etched therein, wherein the openings are individually coated with the conductive material to allow the individually addressable potentials to be applied to the etched openings.

3. The apparatus of claim 1, wherein the individually addressable potentials are determined at least partially based on the focus shift expected of at least one additional lens.

4. The apparatus of claim 1, wherein the apparatus is adapted to serve as a multi-beam electron beam column in an inspection system.

5. An apparatus, comprising:
an electron source;
a multi-lens array configured to produce a plurality of beamlets utilizing electrons provided by the electron source, the multi-lens array further configured to shift a focus of at least one particular beamlet of the plurality of beamlets such that the focus of the at least one particular beamlet is different from a focus of at least one other beamlet of the plurality of beamlets; and
at least one additional lens configured to receive the plurality of beamlets and deliver the plurality of beamlets toward a target, wherein the multi-lens array includes at least two electrostatic plates with openings defined therein to form an array of lenses, wherein the at least two electrostatic plates comprise a first electrostatic plate and a second electrostatic plate, wherein an insulating layer is positioned between the first electrostatic plate and the second electrostatic plate, wherein the first electrostatic plate and the second electrostatic plate each include a plurality of etched openings, wherein the etched openings are individually coated with a conductive material to allow individually addressable potentials to be applied to the etched openings via a contact pad, wherein the insulating layer includes a plurality of openings, wherein the size of the openings of the insulating layer is larger than the size of the etched openings of the first electrostatic plate and the second electrostatic plate, wherein the insulating layer includes charge drains to mitigate cross-talk between the first electrostatic plate and the second electrostatic plate.

6. The apparatus of claim 5, wherein the individually addressable potentials are determined at least partially based on the focus shift expected of the at least one additional lens.

7. An inspection system, comprising:
an electron source;
a multi-lens array configured to produce a plurality of beamlets utilizing electrons provided by the electron source, the multi-lens array further configured to shift a focus of at least one particular beamlet of the plurality of beam lets such that the focus of the at least one particular beamlet is different from a focus of at least one other beam let of the plurality of beam lets;

at least one additional lens configured to receive the plurality of beamlets and deliver the plurality of beamlets toward a subject of inspection; and a detector configured to produce one or more images of the subject of inspection by scanning the subject of inspection with the plurality of beamlets, wherein the multi-lens array includes at least two electrostatic plates with openings defined therein to form an array of micro-einzel lenses, wherein the at least two electrostatic plates comprise a first electrostatic plate and a second electrostatic plate, wherein an insulating layer is positioned between the first electrostatic plate and the second electrostatic plate, wherein the first electrostatic plate and the second electrostatic plate each include a plurality of etched openings, wherein the etched openings are individually coated with a conductive material to allow individually addressable potentials to be applied to the etched openings via a contact pad, wherein the insulating layer includes a plurality of openings, wherein the size of the openings of the insulating layer is larger than the size of the etched openings of the first electrostatic plate and the second electrostatic plate, wherein the insulating layer includes charge drains to mitigate cross-talk between the first electrostatic plate and the second electrostatic plate.

8. The inspection system of claim 7, wherein the individually addressable potentials are determined at least partially based on the focus shift expected of the at least one additional lens.

* * * * *